US009244582B2

(12) United States Patent
Park et al.

(10) Patent No.: US 9,244,582 B2
(45) Date of Patent: Jan. 26, 2016

(54) TOUCH PANEL

(71) Applicant: SAMSUNG ELECTRO-MECHANICS CO., LTD., Suwon (KR)

(72) Inventors: Jang Ho Park, Suwon (KR); Doo Ho Park, Suwon (KR); Jung Ryoul Lim, Suwon (KR); Yong Suk Kim, Suwon (KR); In Hyun Jang, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/462,838

(22) Filed: Aug. 19, 2014

(65) Prior Publication Data
US 2015/0293559 A1    Oct. 15, 2015

(30) Foreign Application Priority Data

Apr. 11, 2014    (KR) .................. 10-2014-0043502

(51) Int. Cl.
*G06F 3/044*    (2006.01)
*G06F 1/16*    (2006.01)
*H05K 1/00*    (2006.01)

(52) U.S. Cl.
CPC  *G06F 3/044* (2013.01); *G06F 1/16* (2013.01); *H05K 1/00* (2013.01); *G06F 2203/04112* (2013.01)

(58) Field of Classification Search
CPC . G06F 1/16; G06F 3/044; G06F 2203/04112; H05K 1/00
USPC ................. 345/173–174; 173/253; 178/18.06
See application file for complete search history.

(56) References Cited

U.S. PATENT DOCUMENTS

| 2009/0219258 | A1* | 9/2009 | Geaghan | G06F 3/044 345/173 |
| 2013/0063371 | A1* | 3/2013 | Lee | G06F 3/044 345/173 |
| 2013/0207911 | A1* | 8/2013 | Barton | G06F 3/0488 345/173 |
| 2013/0327562 | A1* | 12/2013 | Yang | H05K 1/09 174/255 |
| 2014/0320769 | A1* | 10/2014 | Masuda | G06F 3/041 349/12 |
| 2015/0060120 | A1* | 3/2015 | Park | G06F 3/044 174/257 |
| 2015/0068032 | A1* | 3/2015 | Cok | G06F 3/047 29/846 |
| 2015/0068789 | A1* | 3/2015 | Cok | H05K 1/117 174/253 |
| 2015/0271930 | A1* | 9/2015 | Cok | G06F 3/044 156/60 |

FOREIGN PATENT DOCUMENTS

| KR | 10-2010-0137483 | 12/2010 |
| KR | 10-2012-0102350 | 9/2012 |
| WO | WO 2009/154812 A2 | 12/2009 |

* cited by examiner

*Primary Examiner* — Dmitriy Bolotin
(74) *Attorney, Agent, or Firm* — NSIP Law

(57) ABSTRACT

A touch panel may include a substrate; a printing part formed on a bezel area of the substrate; and a plurality of electrodes provided on the substrate and the printing part and including conductive wires configuring a plurality of unit cells having a mesh shape. Portions of wires configuring each of the plurality of unit cells overlapped with a boundary line between the substrate and the printing part among the plurality of unit cells are disconnected.

14 Claims, 5 Drawing Sheets

TOUCH PANEL

CROSS-REFERENCE TO RELATED APPLICATION

This application claims the benefit of Korean Patent Application No. 10-2014-0043502 filed on Apr. 11, 2014, with the Korean Intellectual Property Office, the disclosure of which is incorporated herein by reference.

BACKGROUND

The present disclosure relates to a touch panel.

Capacitive type touchscreens may include a plurality of electrodes having a predetermined pattern and defining a plurality of nodes in which changes in capacitance are generated by touch interactions. In the plurality of nodes distributed on a two-dimensional plane, a change in self-capacitance or a change in mutual-capacitance may be generated by a touch interaction. Coordinates of a touch interaction may be calculated by applying a weighted average method, or the like, to the changes in capacitance generated in the plurality of nodes.

In a touch panel, a sensing electrode recognizing a touch interaction may include indium tin oxide (ITO). However, indium is a rare earth metal which is relatively expensive and has accordingly low competitiveness in price. In addition, global indium reserves are expected to be severely depleted within the next decade, such that a stable supply thereof may not be possible.

Accordingly, a research for forming electrodes using opaque conductive wires has been conducted, wherein electrodes formed of the conductive wires have excellent electrical conductivity and may allow for currents to be smoothly supplied as compared with ITO or a conductive polymer.

In the case that such opaque conductive wires are used as electrodes for the touchscreens, the conductive wires are designed to have a fine line width and a regular pattern in order to prevent the conductive wires from being seen by users. However, since an aperture ratio of the electrode in a portion thereof adjacent to a bezel area of the touch panel is sharply reduced and regularity of the conductive wires is lost, the portion adjacent to the bezel area may be somewhat dark when viewed and the conductive wires in the portion may be able to be seen by the user.

RELATED ART DOCUMENT (Patent Document 1) Korean Patent Laid-Open Publication No. 2010-0137483

SUMMARY

An exemplary embodiment in the present disclosure may provide a touch panel capable of securing an aperture ratio of an electrode in a portion thereof adjacent to a bezel part by disconnecting a portion of lines configuring a unit cell having a mesh shape near a boundary line between a substrate and the bezel part.

According to an exemplary embodiment in the present disclosure, a touch panel may include: a substrate; a bezel part formed in a bezel area of the substrate; and a plurality of electrodes provided on the substrate and the bezel part and including conductive wires configuring a plurality of unit cells having a mesh shape, wherein portions of wires configuring each of the plurality of unit cells overlapped with a boundary line between the substrate and the bezel part among the plurality of unit cells are disconnected.

According to an exemplary embodiment in the present disclosure, a touch panel may include: a substrate partitioned into a bezel area and an active area; a bezel formed in the bezel area; and a plurality of electrodes provided on the bezel area and the active area and including conductive wires configuring a plurality of unit cells having a mesh shape, wherein portions of wires configuring each of the plurality of unit cells among the plurality of unit cells positioned within a reference distance to be close to the active area side from a boundary line between the bezel area and the active area are disconnected.

The portions of the wires configuring each of the plurality of unit cells overlapped with the boundary line or each of the plurality of unit cells positioned in the range less than the reference distance may be disconnected on the substrate or the active area.

All or portions of the respective wires formed in one direction and intersecting with the boundary line among the wires configuring each of the plurality of unit cells overlapped with the boundary line or each of the plurality of unit cells positioned in the range less than the reference distance may be disconnected.

The respective wires formed in a direction which is different from one direction and intersecting with the boundary line among the wires configuring each of the plurality of unit cells overlapped with the boundary line or each of the plurality of unit cells positioned in the range less than the reference distance may have a wire width wider than that of wires which do not intersect with the boundary line.

The reference distance may be two times a pitch of each of the plurality of unit cells and may be 2 mm.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Figure 1:
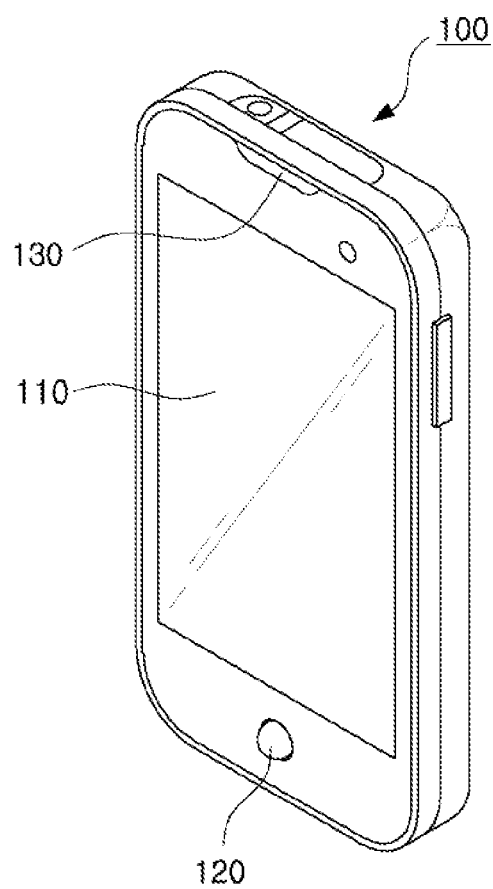
FIG. 1 is a perspective view showing an appearance of an electronic device including a touch panel according to an exemplary embodiment in the present disclosure.

FIG. 1 is a perspective view showing an appearance of an electronic device including a touch panel according to an exemplary embodiment of the present disclosure.

Referring to FIG. 1, an electronic device 100 according to the present exemplary embodiment may include a display apparatus 110 for outputting a screen, an interaction unit 120, an audio unit 130 for outputting an audio, and a touchscreen apparatus integrated with the display apparatus 110, wherein the touchscreen apparatus may include a touch panel.

As shown in FIG. 1, in the case of a mobile device, the touchscreen apparatus may be generally provided in the state in which it is integrated with the display apparatus and needs to have light transmissivity high enough to transmit a screen displayed by the display apparatus. Therefore, the touchscreen apparatus may be implemented by forming electrodes using a material having electrical conductivity on a transparent substrate formed of a material such as a polyethylene terephthalate (PET) film, a polycarbonate (PC) film, a polyethersulfone (PES) film, a polyimide (PI) film, a polymethlymethacrylate (PMMA) film, a cyclo-olefin polymer (COP) film, a soda glass, or a tempered glass. A wiring pattern connected to the electrode formed of the electrical conductive material may be disposed in a bezel area of the touchscreen apparatus and be visually shielded by the bezel area.

Since it is assumed that the touchscreen apparatus is operated in a capacitive type, the touchscreen apparatus may include a plurality of electrodes having a predetermined pattern. In addition, the touchscreen apparatus according to an exemplary embodiment of the present disclosure may include a capacitance sensing circuit detecting capacitance changes generated in the plurality of electrodes, an analog-to-digital converting circuit converting an output signal of the capacitance sensing circuit into a digital value, a calculating circuit determining a touch interaction using data converted into the digital value, and the like.

Figure 2:
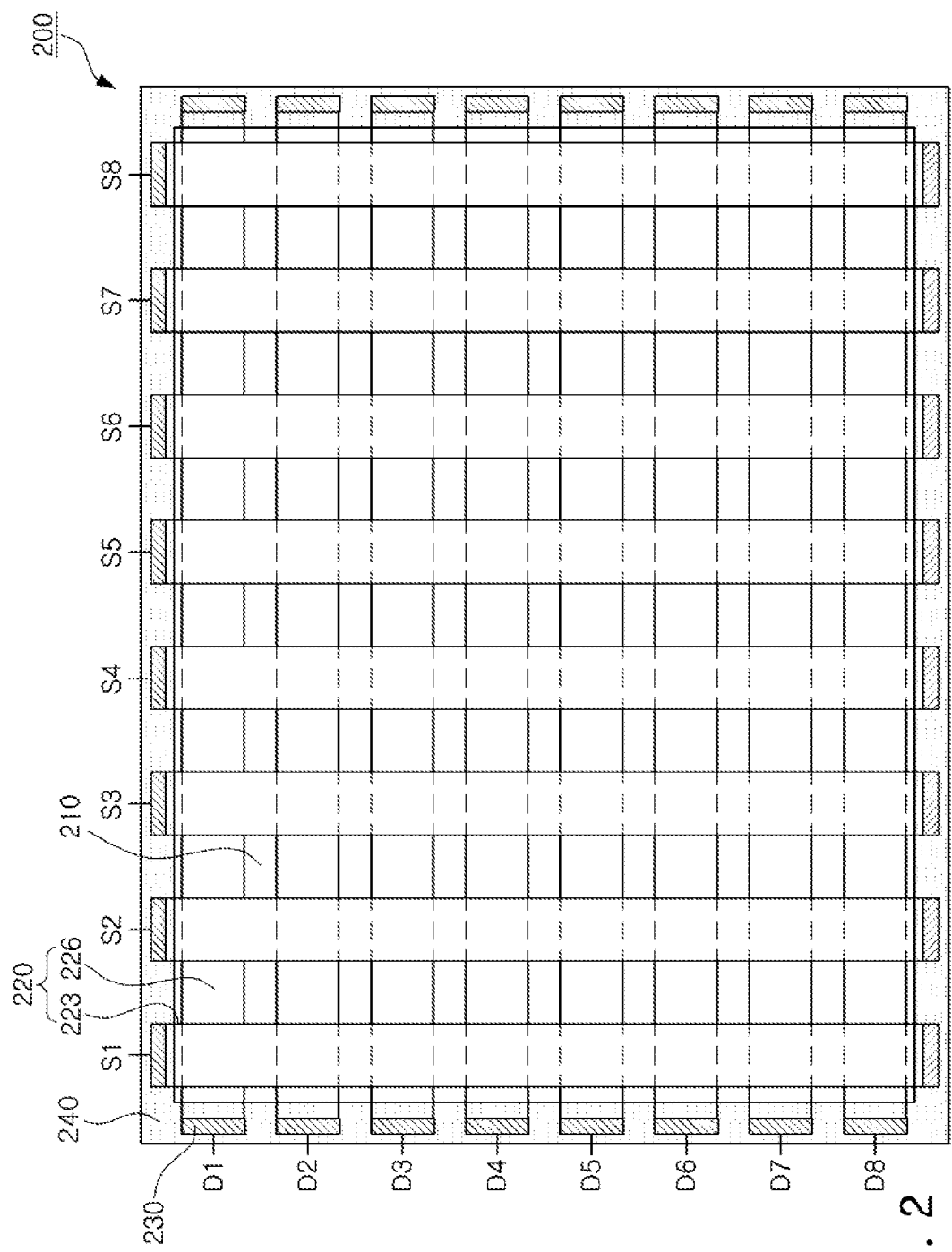
FIG. 2 is a front view of the touch panel according to an exemplary embodiment of the present disclosure.

FIG. 2 is a front view of the touch panel according to an exemplary embodiment of the present disclosure.

Referring to FIG. 2, a touch panel 200 according to the present exemplary embodiment may include a substrate 210, electrode parts 220 provided on the substrate 210, a pad part 230 including a plurality of pads connected to the electrode parts 220, respectively, and a bezel part 240.

Although not shown in FIG. 2, the pad part 230 connected to the electrode parts 220, respectively, may be electrically connected to a circuit board attached to one end of the substrate 210 through wirings and bonding pads. The circuit board may be mounted with a controller integrated circuit to detect sensing signals generated in the electrode parts 220 and determine touch interactions from the sensing signals.

The substrate 210 may be a transparent substrate on which the electrode parts 220 are to be formed. Therefore, the substrate 210 may be formed of a material such as a polyethylene terephthalate (PET) film, a polycarbonate (PC) film, a polyethersulfone (PES) film, a polyimide (PI) film, polymethylmethacrylate (PMMA) film, cyclo-olefin polymers (COP) film, a soda glass, or a tempered glass, as described above.

The electrode parts 220 may include first electrodes 223 extended in an X axis direction and second electrodes 226 extended in a Y axis direction. The first electrodes 223 and the second electrodes 226 are provided on both surfaces of the substrate 210 or are provided on different substrates 210, such that they may intersect with each other. In the case in which both of the first electrodes 223 and the second electrodes 226 are provided on one surface of the substrate 210, a predetermined insulating layer may be partially formed at intersection points between the first electrodes 223 and the second electrodes 236. In addition, unlike this, the first electrodes 223 and the second electrodes 226 may be provided on different substrates so as to intersect with each other.

An apparatus electrically connected to the electrode parts 220 to sense the touch interaction may detect the changes in capacitances generated in the electrode parts 220 by the touch interaction and sense the touch interaction from the detected capacitance changes. The first electrodes 223 may be connected to channels defined as D1 to D8 in the controller integrated circuit to thereby be applied with predetermined driving signals, and the second electrodes 226 may be connected to channels defined as S1 to S8 to thereby be used for the touch sensing apparatus to detect a sensing signal. Here, the controller integrated circuit may detect a mutual capacitance change generated between the first and second electrodes 223 and 226 to obtain the sensing signal and may be operated in a scheme in which it sequentially applies the driving signals to each of the first electrodes 223 and simultaneously detects the changes in capacitances in the second electrodes 226.

When the driving signals are applied to the first electrodes 223 through the channels D1 to D8, mutual capacitance may be generated between the first electrodes 223 to which the driving signals are applied and the second electrodes 226. When a touch object touches the touch panel, changes in capacitance may be generated in the mutual capacitance generated between the first and second electrodes 223 and 226 that are adjacent to an area touched by the touch object. The changes in capacitance may be proportional to an area of an overlapped area between a touched object and the first electrode 223 and the second electrode 226 to which the driving signal is applied.

Figure 3:
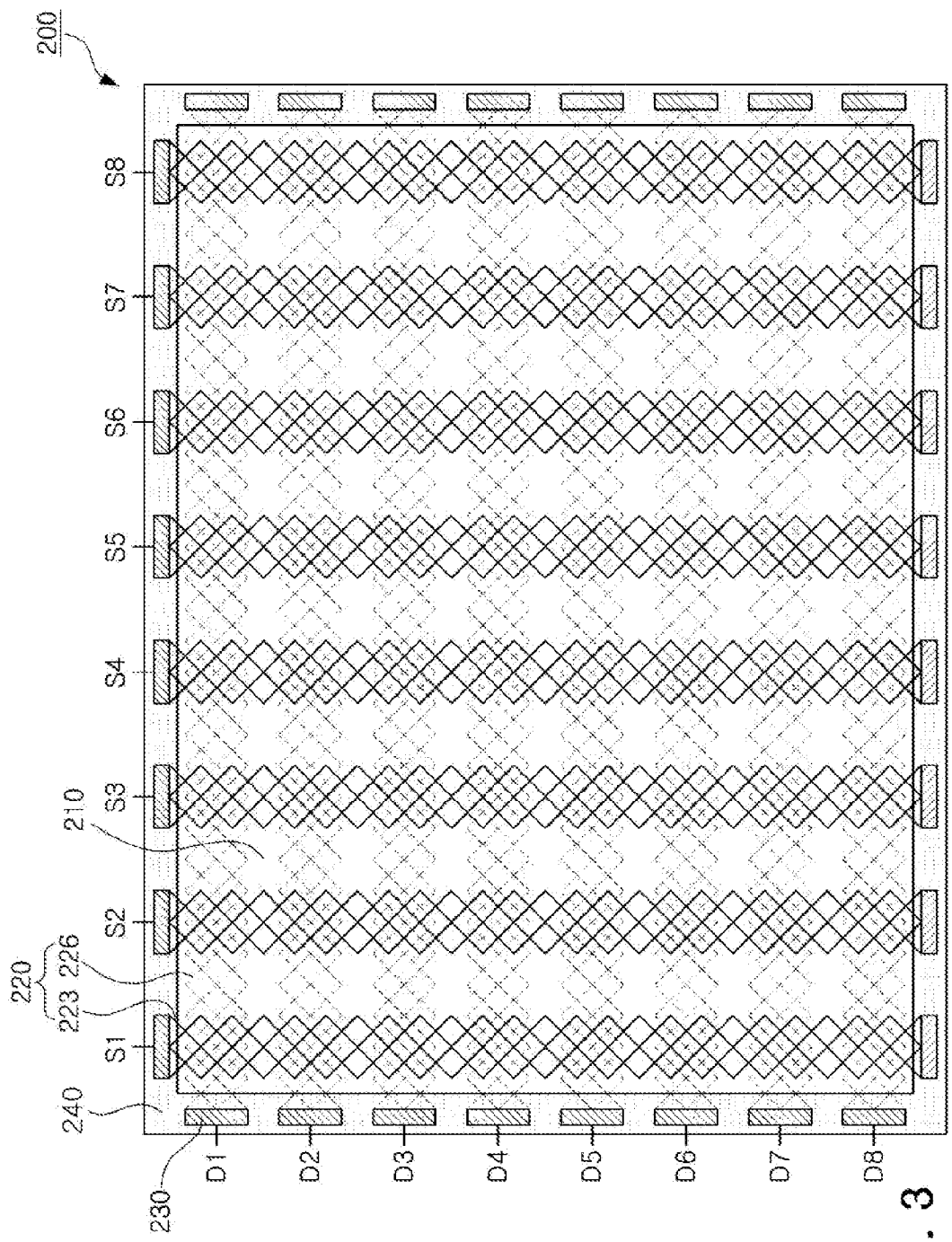
FIG. 3 is a view showing the touch panel according to an exemplary embodiment in FIG. 2 in more detail.

FIG. 3 is a view showing the touch panel according to an exemplary embodiment of FIG. 2 in more detail.

Referring to FIG. 3, the electrode part 220 may be formed of conductive wires, wherein the conductive wire configuring the electrode part 220 may have a net or mesh shape. The conductive wire has the net or mesh shape, such that a phenomenon that patterning marks are viewed in an area in which an indium-tin oxide (ITO) electrode is present according to related art may be decreased, and transmissivity of the touch panel may be improved.

Although FIG. 3 shows a case in which the conductive wire configuring the electrode part 220 has a rhombus or quadrangular shape, the present disclosure is not limited thereto and may include a range which may be apparently or easily derived by a person skilled in the art such as a hexagonal shape, an octagonal shape, a diamond shape, a random shape, and the like.

The conductive wire configuring the electrode part 220 may be formed of any one of silver (Ag), aluminum (Al), chrome (Cr), nickel (Ni), molybdenum (Mo), and copper (Cu), or an alloy thereof, wherein the electrode part 220 is formed of a metal, such that a resistance value of the electrode may be decreased and conductivity and detecting sensitivity may be improved.

The pad part 230, a wire for electrically connecting the pad part 230 and the circuit board to each other, the bonding pad, and the like may be typically formed of an opaque metal material and the bezel part 240 may be provided to a predetermined area on the substrate 210 in order to visually shield the above-mentioned elements formed of the opaque metal material.

The bezel part 240 is provided to an area of the substrate 210 except for an area (view area) in which a screen output from a display apparatus applied with a touch interaction of the user and integrally formed with the touch panel is viewed by the user, and is generally positioned at an edge side of the substrate 210. Hereinafter, the area having the bezel part 240 provided thereto is referred to as a bezel area and other areas are referred to as active areas for convenience of explanation.

Figure 4:
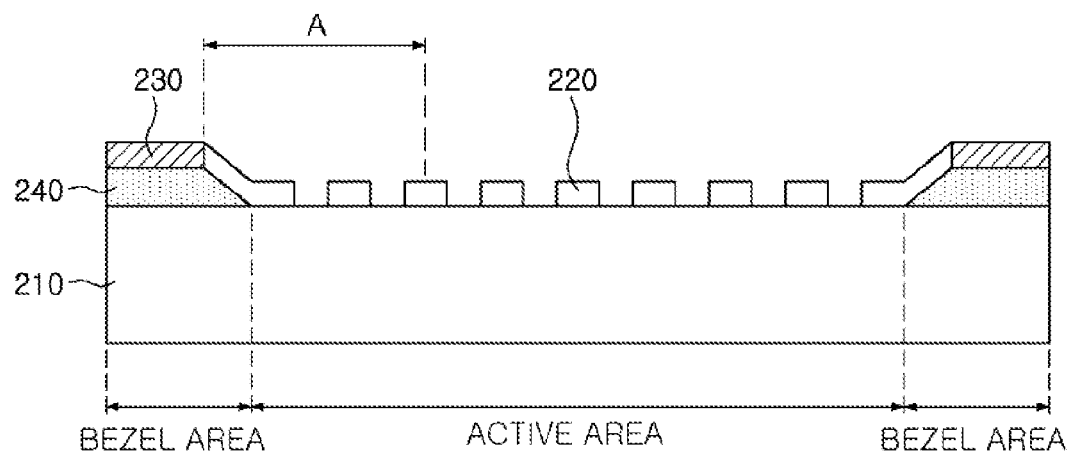
FIG. 4 is a cross-sectional view of the touch panel according to an exemplary embodiment in the present disclosure.

FIG. 4 is a cross-sectional view of the touch panel according to an exemplary embodiment of the present disclosure.

As shown in FIG. 4, the bezel part 240 is provided on the substrate to be wider than the area having the pad part provided thereon so as to more reliably shield the opaque pad part 230. Although the present exemplary embodiment illustrates a case in which the bezel part 240 is stacked on the substrate 210, the bezel part 240 may be buried in the substrate 210, unlike those as described above.

The conductive wires of the electrode parts 220 may be extended from the transparent substrate 210 to the bezel part 240 side and may be connected to the pad parts 230. In the case in which the conductive wires of the electrode parts 220 are extended from the substrate 210 to the opaque bezel part 240, an aperture ratio of the electrode part 220 configured by the conductive wires formed in the mesh shape may be sharply reduced, such that transmissivity of the touch panel may be reduced.

Figure 5:
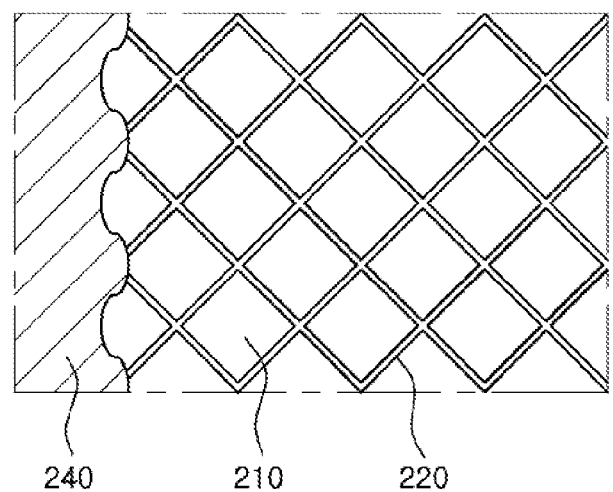
FIG. 5 is a cross-sectional view schematically showing part A of FIG. 4.

FIG. 5 is a cross-sectional view schematically showing part A of FIG. 4. In the case in which the bezel part 240 is formed by a printing method, the bezel part 240 does not form a perfect straight line shape, but forms a straight line shape having a fine concave and convex shape. Since the irregular shape of the bezel part 240 decreases regularity of the conductive wires of the electrode part 220, it is apprehended that visibility of the conductive wires may be increased.

According to the present exemplary embodiment, by removing portions of the conductive wires of the electrode parts 220 adjacent to the bezel area, the aperture ratio of the electrode parts 220 over the entire area may be constantly maintained and invisibility of the conductive wires may be increased.

Hereinafter, the touch panel according to the present exemplary embodiment will be described in detail with reference to FIGS. 6 and 7.

Figure 6:
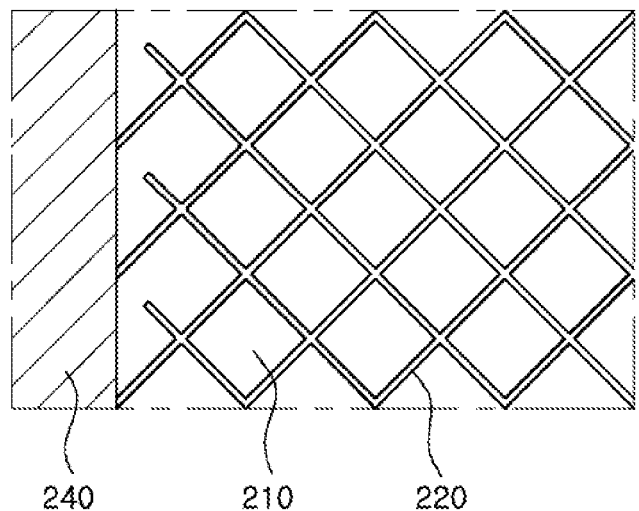
FIGS. 6 and 7 are views schematically showing conductive wires of electrode parts according to various exemplary embodiments in the present disclosure.
Figure 7:
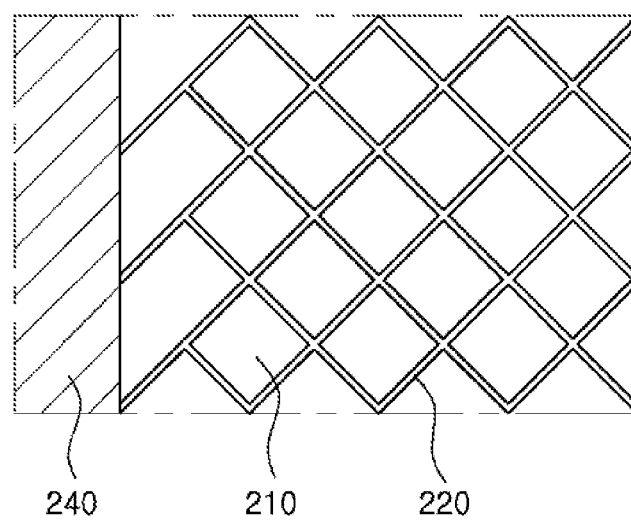

FIGS. 6 and 7 are views schematically showing conductive wires of electrode parts according to various exemplary embodiments of the present disclosure.

As described above, the conductive wires of the electrode parts 220 are formed in the mesh shape. In this case, the mesh shape may be configured by a plurality of unit cells.

According to the present exemplary embodiment, portions of the wires configuring each of the plurality of unit cells overlapped with a boundary line between the substrate 210 and the bezel part 240 among the plurality of unit cells of the conductive wires are disconnected on the substrate 210, such that the aperture ratio of the electrode parts 220 adjacent to the bezel area may be secured.

In addition, portions of the wires configuring each of the plurality of unit cells which are positioned in the range less than a reference distance from a boundary line between the bezel area and the active area to the active area side among the plurality of unit cells may be disconnected on the active area. In this case, the reference distance may be two times a pitch of each of the plurality of unit cells and may be 2 mm, by way of example.

As shown in FIGS. 6 and 7, the unit cell may be formed in a quadrangular shape, and may be formed in a shape such as a hexagonal shape, an octahedral shape, or the like as described above. That is, the unit cell is configured by the wires having a constant direction, wherein the unit cell having the quadrangular shape may be configured by four wires in two directions, the unit cell having the hexagonal shape may be configured by six wires in three directions, and the unit cell having the octahedral shape may be configured by eight wires in four directions.

As such, in the case in which the unit cell is formed in a polygonal shape, two wires formed in two directions among wires configuring each of the plurality of unit cells overlapped with the boundary line or positioned in the range less than the reference distance may each intersect with the boundary line. According to the present exemplary embodiment, the respective wires formed in one direction and intersecting with the boundary line among the wires configuring each of the plurality of unit cells overlapped with the boundary line or positioned in the range less than the reference distance may be disconnected on the substrate 210. Although FIG. 6 shows a case in which the portions of the respective wires formed in one direction and intersecting with the boundary line are disconnected, the entire wires may also be disconnected as shown in FIG. 7.

In this case, in the case in which the respective wires formed in one direction and intersecting with the boundary line are removed from the substrate 210, the resistance is increased, such that conductivity and detection sensitivity may be decreased. In the case in which the wires formed in other directions are disconnected, the disconnection may be caused. In order to prevent the above-mentioned problems, according to the present exemplary embodiment, the respective wires formed in a direction which is different from one direction and intersecting with the boundary line may have a wire width wider than that of wires which do not intersect with the boundary line.

As set forth above, according to an exemplary embodiment of the present disclosure, transmissivity of the touch panel may be increased by securing the aperture ratio of the electrode at the area adjacent to the bezel part.

While exemplary embodiments have been shown and described above, it will be apparent to those skilled in the art that modifications and variations could be made without departing from the spirit and scope of the present disclosure as defined by the appended claims.

What is claimed is:

1. A touch panel comprising:
a substrate;
a printing part provided on a bezel area of the substrate; and
a plurality of electrodes each provided on the substrate and the printing part and including conductive wires configuring a plurality of unit cells having a mesh shape,
wherein portions of the conductive wires configuring each of the plurality of unit cells overlapped with a boundary line between the substrate and the printing part from a thickness direction of the substrate among the plurality of unit cells are disconnected.

2. The touch panel of claim 1, wherein the portions of the wires configuring each of the plurality of unit cells overlapped with the boundary line are disconnected on the substrate.

3. The touch panel of claim 1, wherein the respective wires formed in one direction and intersecting with the boundary line among the wires configuring each of the plurality of unit cells overlapped with the boundary line are disconnected.

4. The touch panel of claim 3, wherein all the respective wires formed in one direction and intersecting with the boundary line among the wires configuring each of the plurality of unit cells overlapped with the boundary line are disconnected.

5. The touch panel of claim 3, wherein portions of the respective wires formed in one direction and intersecting with the boundary line among the wires configuring each of the plurality of unit cells overlapped with the boundary line are disconnected.

6. The touch panel of claim 3, wherein the respective wires formed in a direction which is different from one direction and intersecting with the boundary line among the wires configuring each of the plurality of unit cells overlapped with the boundary line have a wire width wider than that of wires which do not intersect with the boundary line.

7. A touch panel comprising:
a substrate partitioned into a bezel area and an active area;
a printing part provided on the bezel area; and
a plurality of electrodes provided on the bezel area and the active area and including conductive wires configuring a plurality of unit cells having a mesh shape,
wherein portions of wires configuring each of the plurality of unit cells positioned in the range less than a reference distance from a boundary line between the bezel area and the active area to the active area side among the plurality of unit cells are disconnected.

8. The touch panel of claim 7, wherein the portions of the wires configuring each of the plurality of unit cells positioned in the range less than the reference distance are disconnected on the active area.

9. The touch panel of claim 7, wherein the respective wires formed in one direction and intersecting with the boundary line among a plurality of wires configuring each of the plurality of unit cells positioned in the range less than the reference distance are disconnected.

10. The touch panel of claim 9, wherein all the respective wires formed in one direction and intersecting with the boundary line among a plurality of wires configuring each of the plurality of unit cells positioned in the range less than the reference distance are disconnected.

11. The touch panel of claim 9, wherein portions of the respective wires formed in one direction and intersecting with the boundary line among a plurality of wires configuring each of the plurality of unit cells positioned in the range less than the reference distance are disconnected.

12. The touch panel of claim 9, wherein the respective wires formed in a direction which is different from one direction and intersecting with the boundary line among a plurality of wires configuring each of the plurality of unit cells positioned in the range less than the reference distance have a wire width wider than that of wires which do not intersect with the boundary line.

13. The touch panel of claim 7, wherein the reference distance is two times a pitch of each of the plurality of unit cells.

14. The touch panel of claim 7, wherein the reference distance is 2 mm.

* * * * *